(12) United States Patent
Yu

(10) Patent No.: US 11,043,651 B2
(45) Date of Patent: Jun. 22, 2021

(54) OLED DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Yun Yu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/612,423

(22) PCT Filed: Sep. 19, 2019

(86) PCT No.: PCT/CN2019/106653
§ 371 (c)(1),
(2) Date: Nov. 11, 2019

(87) PCT Pub. No.: WO2020/228213
PCT Pub. Date: Nov. 19, 2020

(65) Prior Publication Data
US 2020/0365825 A1    Nov. 19, 2020

(30) Foreign Application Priority Data
May 13, 2019 (CN) .......................... 201910393523.X

(51) Int. Cl.
*H01L 51/52* (2006.01)
*H01L 27/32* (2006.01)

(52) U.S. Cl.
CPC ...... *H01L 51/5253* (2013.01); *H01L 27/3258* (2013.01); *H01L 2227/323* (2013.01)

(58) Field of Classification Search
None
See application file for complete search history.

(56) References Cited

U.S. PATENT DOCUMENTS

2016/0149155 A1* 5/2016 Kim .................... H01L 27/3276
257/40
2018/0151831 A1* 5/2018 Lee ..................... H01L 27/3223

* cited by examiner

Primary Examiner — Steven M Christopher
(74) Attorney, Agent, or Firm — Mark M. Friedman

(57) ABSTRACT

An organic light-emitting diode (OLED) display panel is provided. The OLED display panel comprises a substrate, inorganic layers, organic layers, a light emitting layer, an encapsulation layer, and a via hole. The via hole is extended through the inorganic layers and the organic layers. The via hole is in a blocking wall area. A side wall of the via hole includes at least one recess. The light emitting layer is discontinuous at the at least one recess. By forming the deep via hole between a through hole area and a display area and also by forming the recess in the side wall of the via hole, continuity of the organic light emitting layer to the through hole area is interrupted, so that the display area is prevented from being entered by water and oxygen.

14 Claims, 7 Drawing Sheets

OLED DISPLAY PANEL AND MANUFACTURING METHOD THEREOF

1. FIELD OF DISCLOSURE

The present invention relates to a field of display devices and in particular, to an organic-light-emitting-diode (OLED) display panel and a manufacturing method thereof.

2. DESCRIPTION OF RELATED ART

There has been a trend to develop full-screen displays in the field of OLED (organic light-emitting diode) display technology. A screen ratio for screens can be further improved by using under-screen camera technology, which is beneficial to realize a full-screen design. The current under-screen camera technology mainly utilizes a through-hole structure and a blind-hole structure. The through-hole design needs to penetrate the substrate in a camera region to form a through hole, which causes a display area to be easily entered by water and oxygen, and thereby leads to poor product reliability.

SUMMARY

The present invention provides an organic light-emitting diode (OLED) display panel and a manufacturing method thereof, so as to solve a problem with a conventional OLED display panel. Conventional OLED display panels adopt a through hole design. The through hole design has a hole which penetrate a substrate in a camera region, thus causing the display area to be easily entered by water and oxygen, thereby affecting product reliability.

Accordingly, the present invention provides a solution as follows. The present invention provides an organic light-emitting diode (OLED) display panel, having a blocking wall area defined therein, the OLED display panel comprising:
a substrate;
multiple inorganic layers disposed on the substrate;
multiple organic layers disposed on the inorganic layers;
a light emitting layer disposed on the organic layers;
an encapsulation layer disposed on the light emitting layer; and
a via hole extended through the inorganic layers and the organic layers;
wherein the via hole is defined in the blocking wall area, a side wall of the via hole comprises at least one recess, the light emitting layer is discontinuous at the at least one recess, a width of the recess along a direction perpendicular to a thickness direction of the substrate is greater than a thickness of the light emitting layer, the encapsulation layer covers the light emitting layer, and the encapsulation layer completely fills the at least one recess.

According to one embodiment of the present invention, two opposite side walls of the via hole comprise two recesses respectively, and two openings of the two recesses face each other.

According to one embodiment of the present invention, the inorganic layers comprise a buffer layer, a gate electrode insulating layer, and an interlayer insulating layer sequentially disposed in a direction away from the substrate.

According to one embodiment of the present invention, the organic layers comprise a planarization layer and a pixel defining layer sequentially disposed in a direction away from the substrate.

According to one embodiment of the present invention, each recess is disposed between the interlayer insulating layer and the gate electrode insulating layer.

According to one embodiment of the present invention, each recess is disposed between the interlayer insulating layer and the planarization layer.

The present invention provides an organic light-emitting diode (OLED) display panel, having a blocking wall area defined therein, the OLED display panel comprising:
a substrate;
multiple inorganic layers disposed on the substrate;
multiple organic layers disposed on the inorganic layers;
a light emitting layer disposed on the organic layers;
an encapsulation layer disposed on the light emitting layer; and
a via hole extended through the inorganic layers and the organic layers, wherein the via hole is defined in the blocking wall area, a side wall of the via hole comprises at least one recess, and the light emitting layer is discontinuous at the at least one recess.

According to one embodiment of the present invention, a width of the recess along a direction perpendicular to a thickness direction of the substrate is greater than a thickness of the light emitting layer.

According to one embodiment of the present invention, the encapsulation layer covers the light emitting layer, and the encapsulation layer completely fills the at least one recess.

According to one embodiment of the present invention, two opposite side walls of the via hole comprise two recesses respectively, and two openings of the two recesses face each other.

According to one embodiment of the present invention, the inorganic layers comprise a buffer layer, a gate electrode insulating layer, and an interlayer insulating layer sequentially disposed in a direction away from the substrate.

According to one embodiment of the present invention, the organic layers sequentially comprise a planarization layer and a pixel defining layer sequentially disposed in a direction away from the substrate.

According to one embodiment of the present invention, the recess is disposed between the interlayer insulating layer and the gate electrode insulating layer.

According to one embodiment of the present invention, the recess is disposed between the interlayer insulating layer and the planarization layer.

The present invention provides a manufacturing method of an organic light-emitting diode (OLED) display panel, comprising following steps:

S10: providing a substrate, wherein a blocking wall area is defined on the substrate;

S20: forming on the substrate multiple inorganic layers, at least one first metal block, and multiple organic layers, wherein the first metal block is disposed in the blocking wall area;

S30: forming a via hole in the blocking wall area, wherein the via hole is extended through the inorganic layers and the organic layers, and a side surface of the first metal block is exposed from the via hole;

S40: etching the first metal block by using an etchant to form a recess in a side wall of the via hole;

S50: forming a light emitting layer on the organic layers, wherein the light emitting layer is discontinuous at the recess; and S60: forming an encapsulation layer on the organic layers, wherein the encapsulation layer covers the light emitting layer, and the encapsulation layer fills the recess completely.

According to one embodiment of the present invention, the first metal block is formed between adjacent inorganic layers, or between adjacent organic layers, or between the inorganic layers and the organic layers.

According to one embodiment of the present invention, the inorganic layers comprise a buffer layer, a gate electrode insulating layer, and an interlayer insulating layer sequentially disposed in a direction away from the substrate.

According to one embodiment of the present invention, step S20 further comprises forming on the substrate an active layer, a gate electrode, and a source/drain electrode outside the blocking wall area.

According to one embodiment of the present invention, step S20 comprises sequentially forming on the substrate a buffer layer, a gate electrode insulating layer, two first metal blocks spaced apart from each other in a same layer, an interlayer insulating layers, a planarization layer, and a pixel defining layer.

According to one embodiment of the present invention, the first metal block is manufactured in a same layer as the gate electrode or the source/drain electrode.

Advantages of the present invention: The deep via hole is formed between an edge of a through hole area and an edge of a display area, and the recess is defined in the side wall of the via hole, so the organic light emitting layer deposited subsequently is disconnected at the recess, and continuity of the organic light emitting layer to the through hole is interrupted, thereby protecting the display area from being entered by water and oxygen and also improving product reliability.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Figure 1:
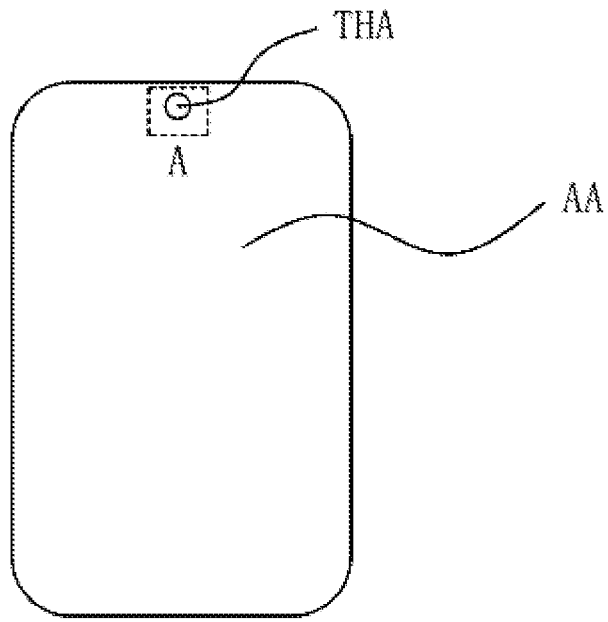
FIG. 1 is a schematic structural view illustrating an organic light-emitting diode (OLED) display panel according to the present invention.

The following description is provided to illustrate the specific embodiments of the present invention. Directional terms such as "upper", "lower", "front", "rear", "left", "right", "inside", "outside", and "side" in the present invention are merely illustrative with reference to the accompanying drawings. Therefore, the directional terms are only for the purpose of illustration and ease of understanding and are not intended to be limiting. In the accompanying drawings, structurally similar elements are denoted by the same reference numerals.

The present invention is directed to solving a problem in conventional organic light-emitting diode (OLED) display panels. Since a through hole is used to install a camera, a substrate in a camera region need to be penetrated, which causes a display area to be easily entered by water and oxygen, and affects a display function. The present invention can solve the above-mentioned problem.

Figure 2:
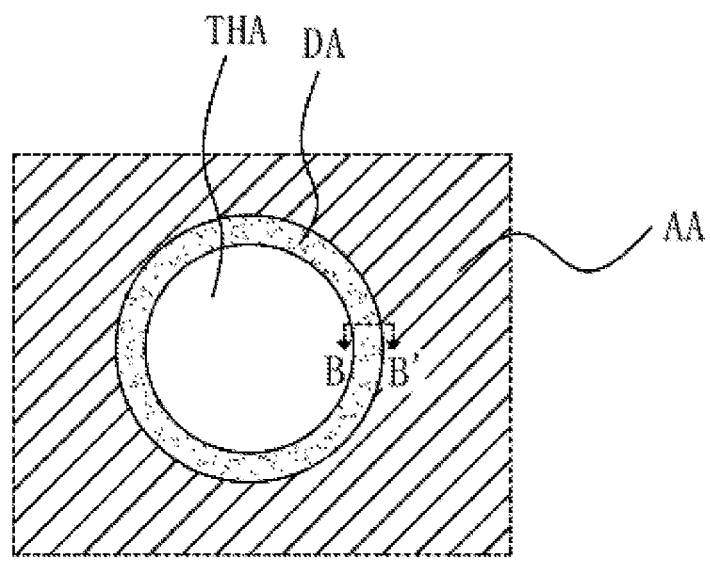
FIG. 2 is an enlarged structural view illustrating position A in FIG. 1.

Referring to FIGS. 1 and 2, the present invention provides an organic light-emitting diode (OLED) display panel. The OLED display panel has a blocking wall area DA, a through hole area THA, and a display area AA.

The through hole area THA is used to install a camera to realize an under-screen camera design. The blocking wall area is defined between the through hole area THA and the display area AA. The blocking wall area DA is a ring structure surrounding the through hole area THA.

The blocking wall area DA is configured to space a boundary of the through hole area THA from a boundary of the display area AA, thereby preventing the display area from being entered by water and oxygen due to a through hole in the through hole area THA, thereby improving product reliability.

The OLED display panel comprises:
a substrate;
multiple inorganic layers disposed on the substrate;
multiple organic layers disposed on the inorganic layers;
a light emitting layer disposed on the organic layers;
an encapsulation layer disposed on the light emitting layer; and
a via hole in the OLED display panel;
wherein the via hole is extended through the inorganic layers and the organic layers, the via hole is defined in the blocking wall area, a side wall of the via hole comprises at least one recess, and the at least one recess is open toward the via hole.

A width of the recess (i.e., a depth of the recess) along a direction perpendicular to a thickness direction of the substrate is greater than a thickness of the light emitting layer, so that it can be ensured that the light emitting layer is discontinuous at the recess after a deposition process.

The encapsulation layer covers the light emitting layer. A thickness of the encapsulation layer is greater than the width of the recess along the direction perpendicular to the thickness direction of the substrate, so that the encapsulation layer is continuous at the recess and completely fills the recess.

The inorganic layers comprise a buffer layer, a gate electrode insulating layer, and an interlayer insulating layer sequentially disposed in a direction away from the substrate. The organic layers sequentially comprise a planarization layer and a pixel defining layer sequentially disposed in a direction away from the substrate.

Two opposite side walls of the via hole comprise two recesses respectively, and two openings of the two recesses face each other. The two recesses are arranged in a same layer, but the recesses can also be disposed in different layers. As a result, the light emitting layer is disconnected in multiple positions in the blocking wall area DA, thereby making the light emitting layer discontinuous and preventing water and oxygen from entering the light emitting layer in the display area AA.

The recess may be formed by etching a metal block. When metal elements such as a gate electrode and a source/drain electrode are formed on the substrate, a metal block pattern in the blocking wall area DA is reserved. After an array substrate of the OLED display panel is made, the array substrate in the blocking wall area DA is dry etched to form a deep vertical via hole, a metal block on at least one side of the via hole is reserved, and a side surface of the metal block is exposed. Thereafter, the metal block is etched using hydrofluoric acid or silver acid, and the recess is formed at a position of the metal block.

Figure 4:
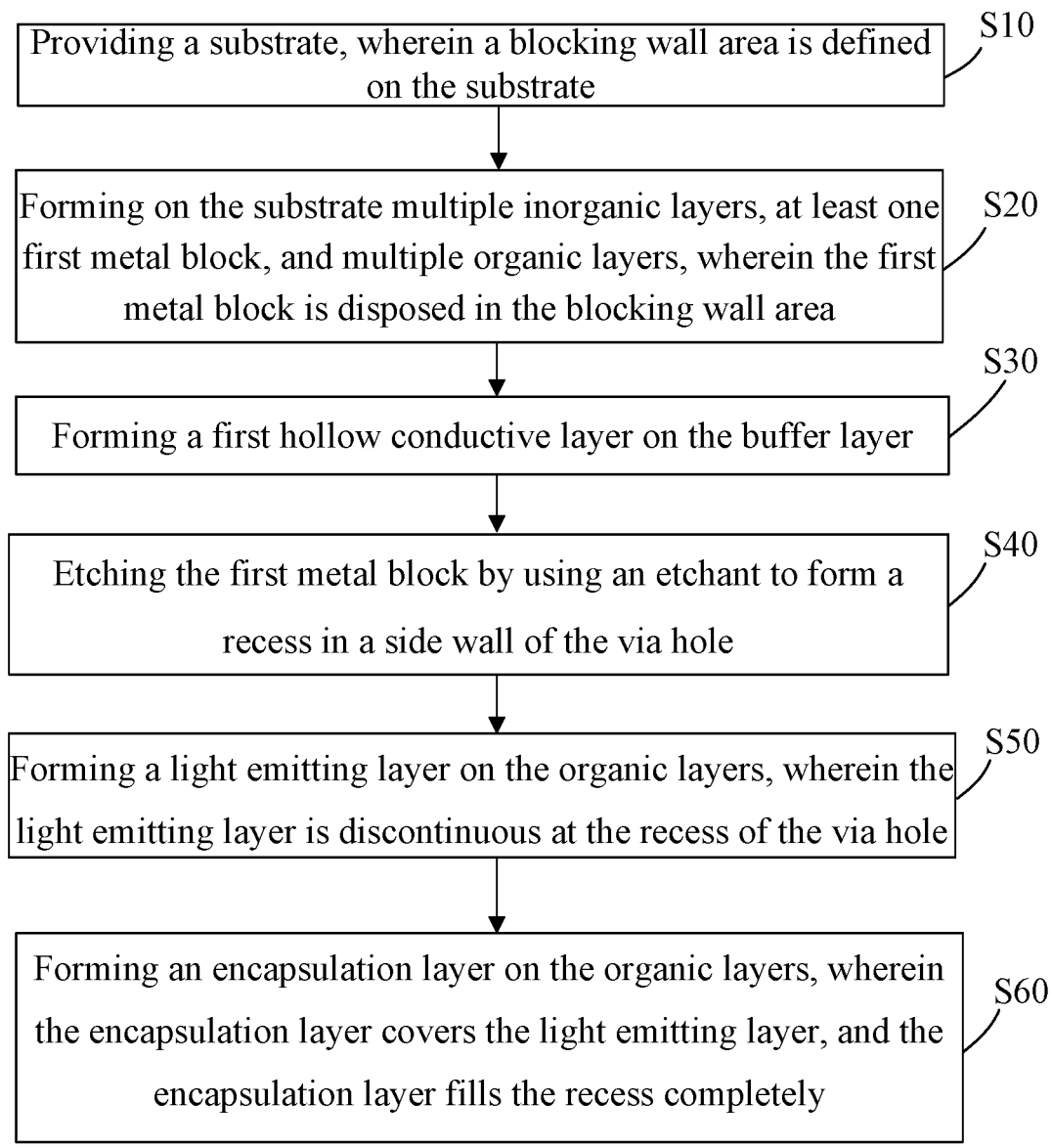
FIG. 4 is a process flow diagram illustrating a manufacturing method of an organic light-emitting diode (OLED) display panel according to the present invention.

Referring to FIG. 4, the present invention provides a manufacturing method of an organic light-emitting diode (OLED) display panel, comprising following steps:

S10: providing a substrate, wherein a blocking wall area is defined on the substrate;

S20: forming on the substrate multiple inorganic layers, at least one first metal block, and multiple organic layers, wherein the first metal block is disposed in the blocking wall area;

S30: forming a via hole in the blocking wall area, wherein the via hole is extended through the inorganic layers and the organic layers, and a side surface of the first metal block is exposed from the via hole;

S40: etching the first metal block by using an etchant to form a recess in a side wall of the via hole;

S50: forming a light emitting layer on the organic layers, wherein the light emitting layer is discontinuous at the recess; and S60: forming an encapsulation layer on the organic layers, wherein the encapsulation layer covers the light emitting layer, and the encapsulation layer completely fills the recess.

The first metal block is formed between adjacent inorganic layers, or between adjacent organic layers, or between the inorganic layers and the organic layers.

If the recess is to be disposed between the interlayer insulating layer and the gate electrode insulating layer, the metal block in the blocking wall area DA is reserved when a gate electrode is formed. Then, the recess is formed by a subsequent etching process. If the recess is to be formed between the interlayer insulating layer and the planarization layer, the metal block in the blocking wall area DA is reserved when a source/drain electrode is formed. Then, the recess is formed by a subsequent etching process.

The OLED display panel and the manufacturing method thereof provided by the present invention are described in detail below with reference to some embodiments.

First Embodiment

Figure 3:
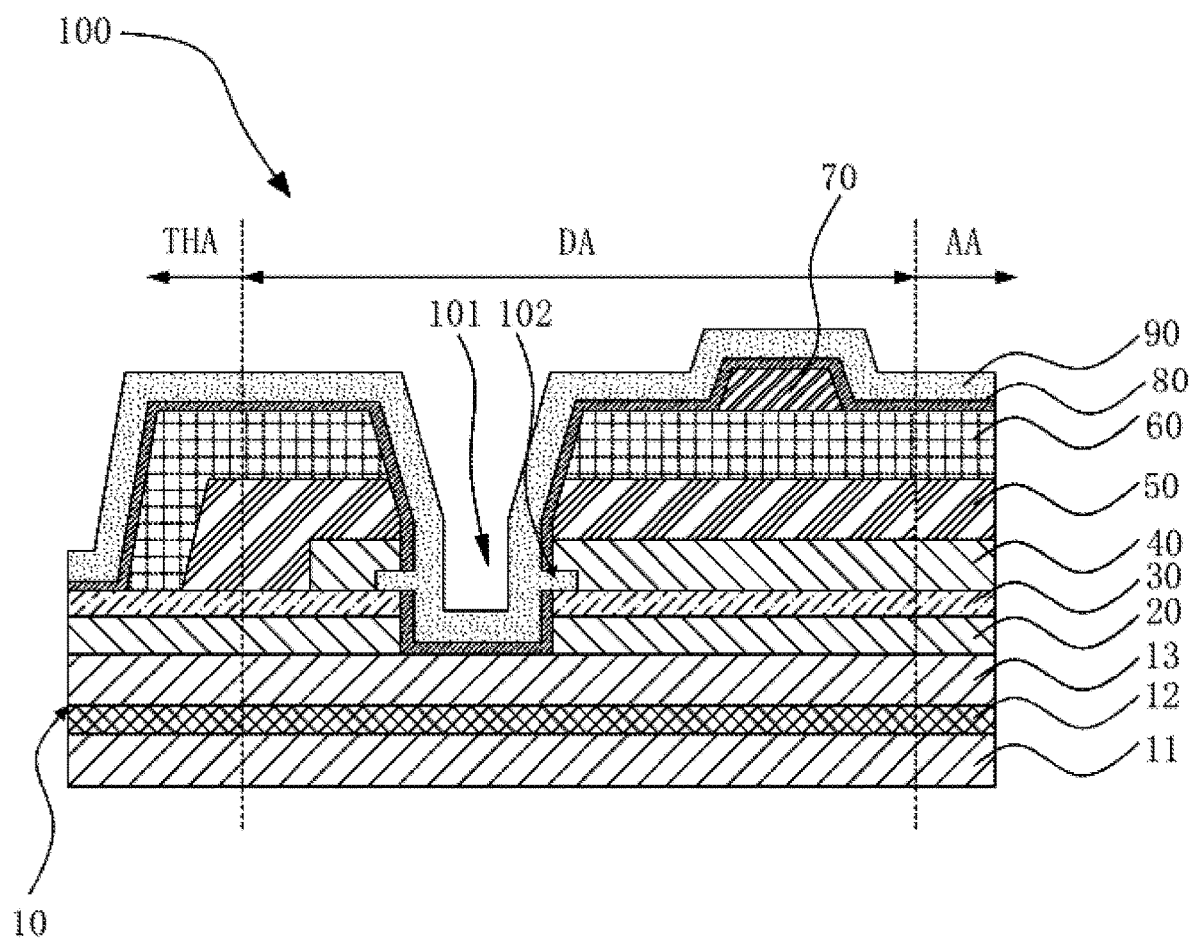
FIG. 3 is a schematic cross-sectional view taken from line B-B' in FIG. 2.

As shown in FIG. 3, an OLED display panel 100 is provided according to the present invention. The OLED display panel 100 comprises:

a substrate 100;
multiple inorganic layers disposed on the substrate;
multiple organic layers disposed on the inorganic layers;
a light emitting layer 80 disposed on the organic layers;
an encapsulation layer disposed on the light emitting layer 80; and
a via hole 101.

A display area AA, a through hole area THA, and a blocking wall area DA disposed between the display area AA and the through hole area THA are defined in the OLED display panel 100.

The display area AA is used to display colors. The through hole area THA is used to place a camera. The blocking wall area DA is used to disconnect the light emitting layer 80, so that the light emitting layer 80 is discontinuous on the substrate 10, thereby preventing water and oxygen from causing corrosion in a portion of the light emitting layer 80 in the display area AA.

The via hole 101 is disposed in the blocking wall area DA. The via hole 101 is extended through the inorganic layers and the organic layers, two opposite side walls of the via hole 101 have two recesses respectively, and two openings of the two recesses face each other.

The light emitting layer 80 is discontinuous at the recesses 102. The encapsulation layer 90 covers the light emitting layer 80, and the encapsulation layer 90 completely fills the recess 102.

Each recess 102 is open toward the via hole 101, and each recess 102 communicates with the via hole 101. A width of the recess 102 along a direction perpendicular to a thickness direction of the substrate 10 is greater than a thickness of the light emitting layer 80. As a result, when the light emitting layer 80 is formed by a deposition process, the light emitting layer 80 is disconnected at the recess 102 due to poor step coverage.

In the present embodiment, the width (i.e., the horizontal width) of the recess 102 in the direction perpendicular to the thickness direction of the substrate 10 is 250 nm, and a thickness of the light emitting layer 80 is 100 nm, so the thickness of the light emitting layer 80 is relative thin, thus making the light emitting layer 80 disconnected at the recess 102 to form a discontinuous layer.

A thickness of the encapsulation layer 90 is greater than the horizontal width of the recess 102, so the encapsulation layer 90 coves the recess 102 well (the encapsulation layer 90 has good step coverage at the recess 102), and the encapsulation layer 90 is not discontinuous at the recess 102. The encapsulation layer 90 completely fills the recess 102.

The encapsulation layer 90 comprises a first inorganic encapsulation layer, an organic encapsulation layer, and a second inorganic encapsulation layer which are sequentially stacked on the light emitting layer 80. The first inorganic encapsulation layer has a thickness of 2 micrometers, which is greater than a depth of the recess 102, so that the first inorganic encapsulation layer is continuous at the recess 102 and can be in direct contact with the inorganic layer on the substrate 10, so that when a through hole is formed in the through hole area THA, the through hole can be defined in the inorganic layers, and an entry path of water and oxygen along the light emitting layer 80 is disconnected. The entry path of water and oxygen is cut off at the recess 102, thereby improving product performance in the display area AA.

In the present embodiment, the substrate 10 includes a first polyimide plate 11, a barrier layer 12, and a second polyimide plate 13 which are sequentially stacked one above the other.

The multiple inorganic layers comprise a buffer layer 20, a gate electrode insulating layer 30, and an interlayer insulating layer 40 which are sequentially disposed on the second polyimide plate 13.

The multiple organic layers comprise a planarization layer 50 and a pixel defining layer 60 sequentially disposed on the interlayer insulating layer 40.

The via hole 101 sequentially penetrates the buffer layer 20, the gate electrode insulating layer 30, the interlayer insulating layer 40, the planarization layer 50, and the pixel defining layer 60.

The OLED display panel 100 further comprises an active layer, a gate electrode, and a source/drain electrode outside the blocking wall area DA. The recess 102 is formed by etching a metal layer disposed in the same layer as the gate electrode.

Please refer to FIGS. 5 to 8 illustrating a manufacturing method of an organic light-emitting diode (OLED) display panel, comprising following steps:

S10: providing a substrate 10, wherein a blocking wall area DA is defined on the substrate 10.

Figure 5:
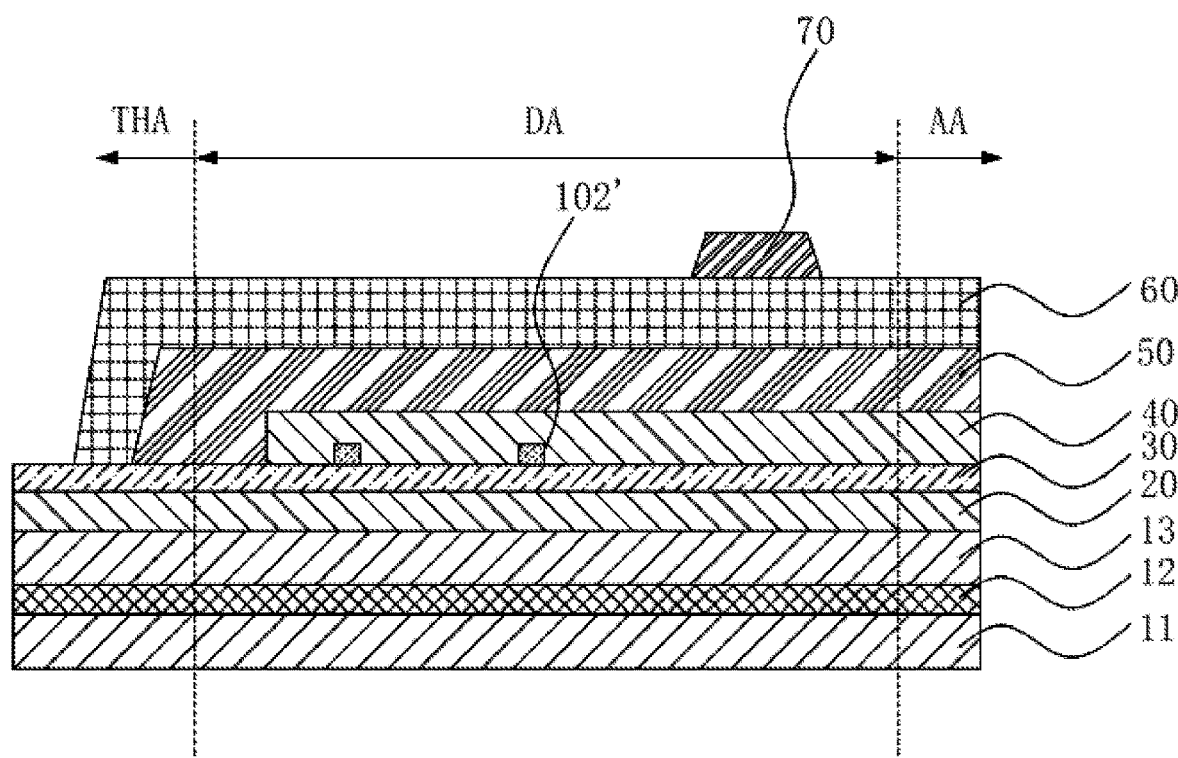
FIGS. 5 to 8 are schematic structural views illustrating the manufacturing method of the OLED display panel according to a first embodiment of the present invention.

As shown in FIGS. 3 and 5, the substrate 10 comprises a first polyimide plate 11, a barrier layer 12, and a second polyimide plate 13 which are sequentially stacked on above the other. On the substrate, a through hole area THA, a blocking wall area DA, and a display area AA are defined.

S20: forming on the substrate 10 multiple inorganic layers, at least one first metal block 102', and multiple organic layers, wherein the first metal block 102' is formed in the blocking wall area DA.

Specifically, the buffer layer 20, the gate electrode insulating layer 30, two first metal block 102' spaced apart from each other in a same layer, the interlayer insulating layer 40, and the planarization layer 50, and the pixel defining layer 60 are sequentially formed on the second polyimide plate 13.

The first metal blocks 102' are made of molybdenum, and a width of each first metal block 102' is 250 nm.

Step S20 further includes forming an active layer, a gate electrode, a source/drain electrode, and the like outside the blocking wall area DA on the substrate 10. In the present embodiment, the two first metal blocks 102' are spaced apart from each other on the gate electrode insulating layer 30. The first metal block 102' and the gate electrode are formed in a same layer. The first metal blocks 102' are formed by reserving two patterned metal blocks of the gate electrode inside the blocking wall area DA in a deposition process of forming the gate electrode.

In alternative embodiments, the first metal blocks 102' may be disposed on other layers, and when other metal elements are produced, the patterned metal remaining in the blocking wall area DA forms the first Metal blocks 102'.

In other embodiments, a second metal block may be disposed in another layer such that multiple recesses are provided in different layers, thereby causing the subsequently deposited light emitting layer 80 to be disconnected at multiple locations, so that a portion of the light emitting layer 80 in the display area AA is isolated from a remaining portion of the light emitting layer 80.

Step S20 further comprises forming a support pad 70 on the pixel defining layer, wherein the support pad 70 is used to provide a certain height to prevent the light emitting layer from being damaged by a mask during a process of depositing an organic light emitting material.

S30: forming a via hole 101 in the blocking wall area DA, wherein the via hole 101 is extended through the inorganic layers and the organic layers, and a side surface of the first metal block 102' is exposed from the via hole 101.

Figure 6:
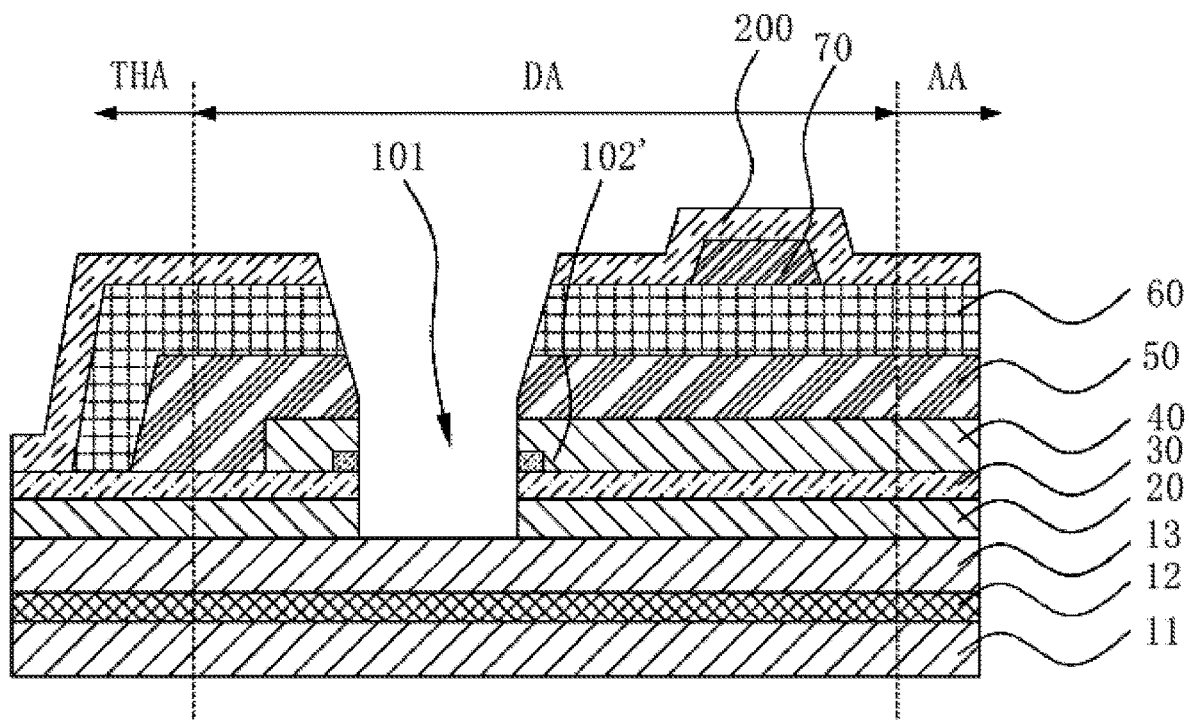

As shown in FIG. 6, a photoresist layer 200 is coated onto the surface of the pixel defining layer 60, and the above-mentioned multiple layers are exposed and etched by using a same photomask. The deep via hole 101 is formed between the two first metal blocks 102'. The via hole 101 exposes two opposite side surfaces of the two first metal blocks 102'. That is, the via hole 101 is disposed between the two opposite side surfaces of the two first metal blocks 102'.

The via hole 101 is sequentially extended through the buffer layer 20, the gate electrode insulating layer 30, the interlayer insulating layer 40, the planarization layer 50, and the pixel defining layer 60.

Figure 7:
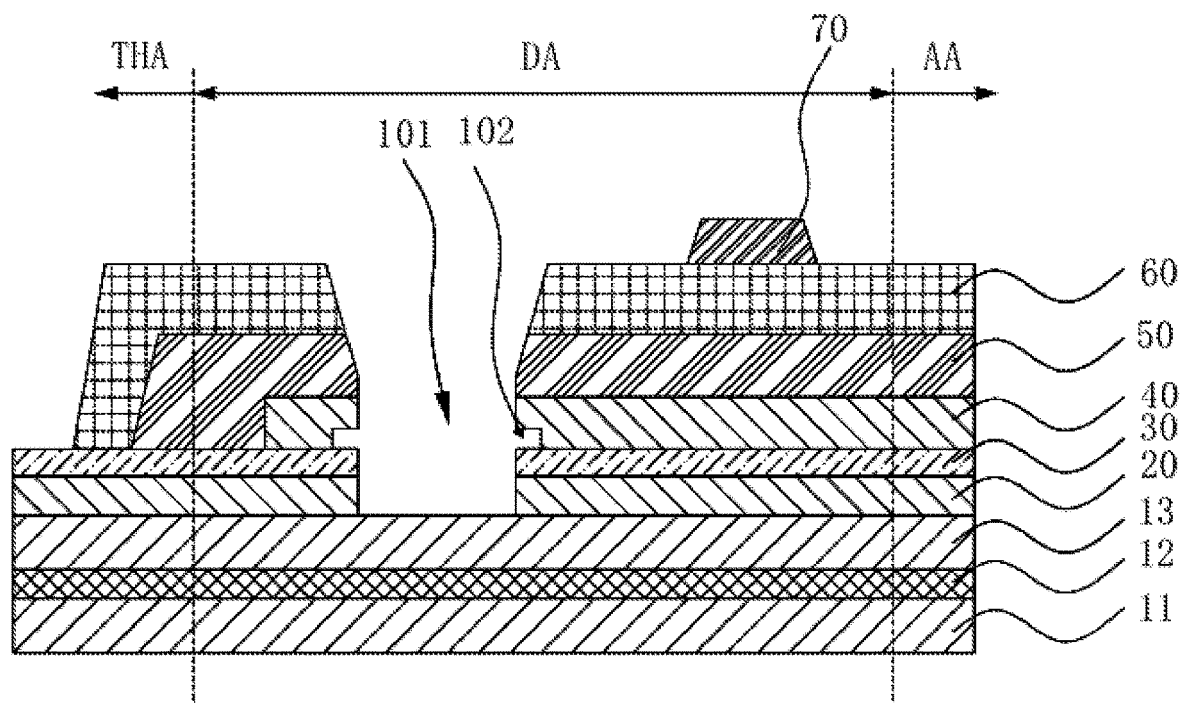

As shown in FIG. 7, in step S40, the first metal block 102' is etched with an etchant, and the recesses 102 are formed on the side wall of the via hole 101.

The etchant may be a silver acid solution or a hydrofluoric acid solution. In the present embodiment, the first metal blocks 102' are etched away by performing a wet etching process using a silver acid solution. After the recesses 102 are formed in the positions of the first metal blocks 102', the photoresist layer 200 is removed.

Figure 8:
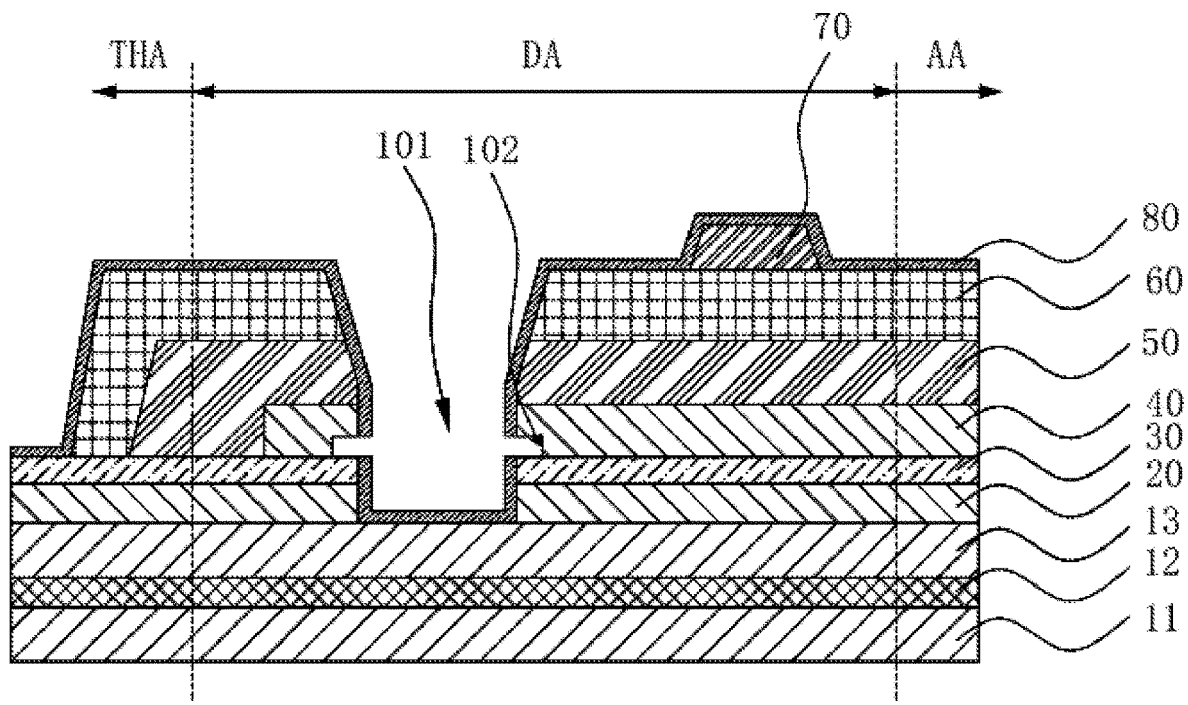

As shown in FIG. 8, in step S50, the light emitting layer 80 is formed on the organic layer, wherein the light emitting layer 80 is discontinuous at the recesses 102 of the via hole 101.

The light emitting layer 80 has a thickness of 100 nm, and the organic light emitting material is deposited on a surface of the pixel defining layer 60 and the side wall of the via hole 101. The deposited organic light emitting material is thin, thus causing poor step coverage. As a result, the light emitting layer 80 is discontinuous at the recesses 102.

S60: as shown in FIG. 3, forming an encapsulation layer 90 on the organic layers, wherein the encapsulation layer 90 covers the light emitting layer 80, and the encapsulation layer 90 completely fills the recesses 102.

The encapsulation layer 90 comprises a first inorganic encapsulation layer, an organic encapsulation layer, and a second inorganic encapsulation layer which are sequentially stacked one above the other. The first inorganic encapsulation layer has a thickness of 2 micrometers, so the first inorganic encapsulation layer has good step coverage at the recess 102 (the first inorganic encapsulation layer covers the recess 102 well). The encapsulation layer 90 forms a continuous film at the recess 102, and is in direct contact with the inorganic layer on the substrate 10, thus improving an effect of blocking water and oxygen.

After the encapsulation layer 90 is produced, the OLED display panel 100 in the through hole area THA is laser-cut to form a through hole for accommodating a camera. The blocking wall area is disposed between an edge of the through hole area THA and an edge of the display area AA, which can effectively prevent entry of water and oxygen and also improve product reliability.

Silver acid has relatively high etching selectivity for molybdenum and inorganic materials, so when silver acid is used to etch the first metal blocks 102' to form the recesses 102, other layers are not damaged. This ensures that the light emitting layer 80 is disconnected at the recess 102 in a subsequent process, and the inorganic encapsulation layer of the encapsulation layer 90 has good step coverage at the recess 102, so the inorganic encapsulation layer is in direct contact with the inorganic layers on the substrate 10. Accordingly, the through hole can be formed in the inorganic layers, and an entry path of water and oxygen along the light emitting layer 80 is cut off.

Second Embodiment

The first metal blocks 102' in this embodiment are disposed in the same layer as the source/drain electrode. The recesses 102 are formed at positions different from the first embodiment. The recesses 102 in the present embodiment are formed by reserving the patterned metal block in the blocking wall area DA when producing the source/drain electrode and then etching the reserved metal block.

Figure 12:
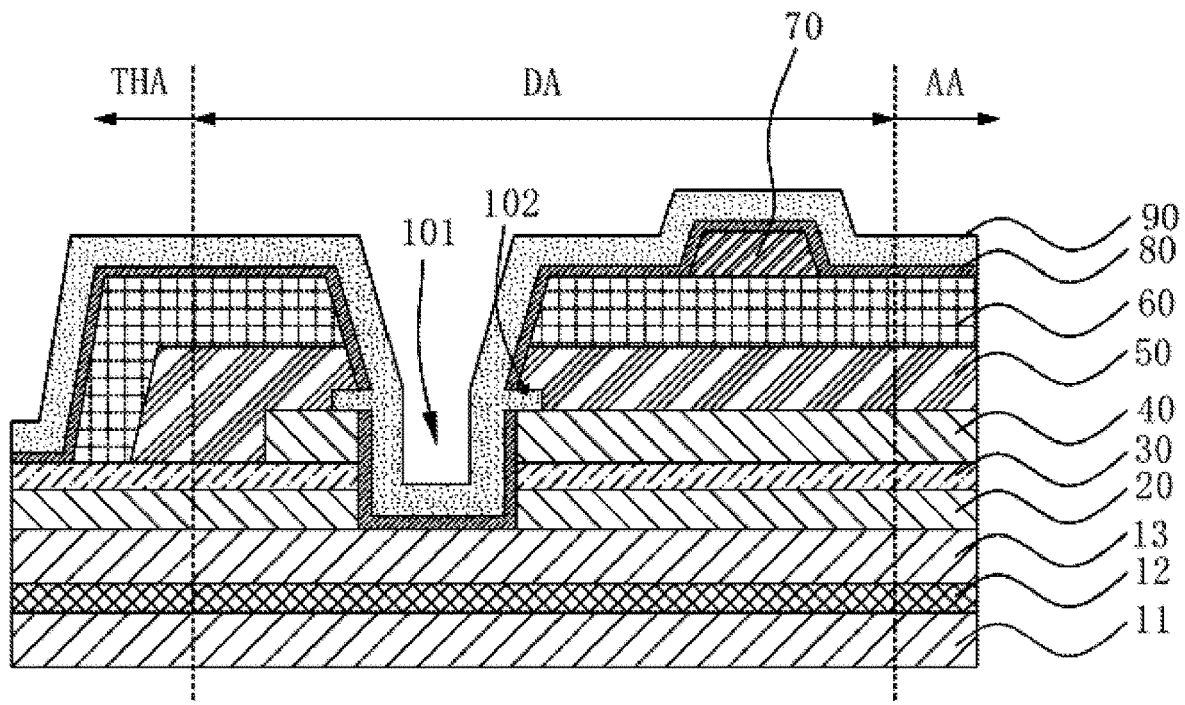
FIG. 12 is a schematic structural view illustrating the OLED display panel according to the second embodiment of the present invention.

As shown in FIG. 12, in the present embodiment, the two recesses 102 are spaced apart from each other and arranged between the interlayer insulating layer 40 and the planarization layer 50. The recess 102 has a depth of 730 nm, and its remaining structure is the same as that in the first embodiment, so a detailed description is not repeated herein for brevity.

Figure 9:
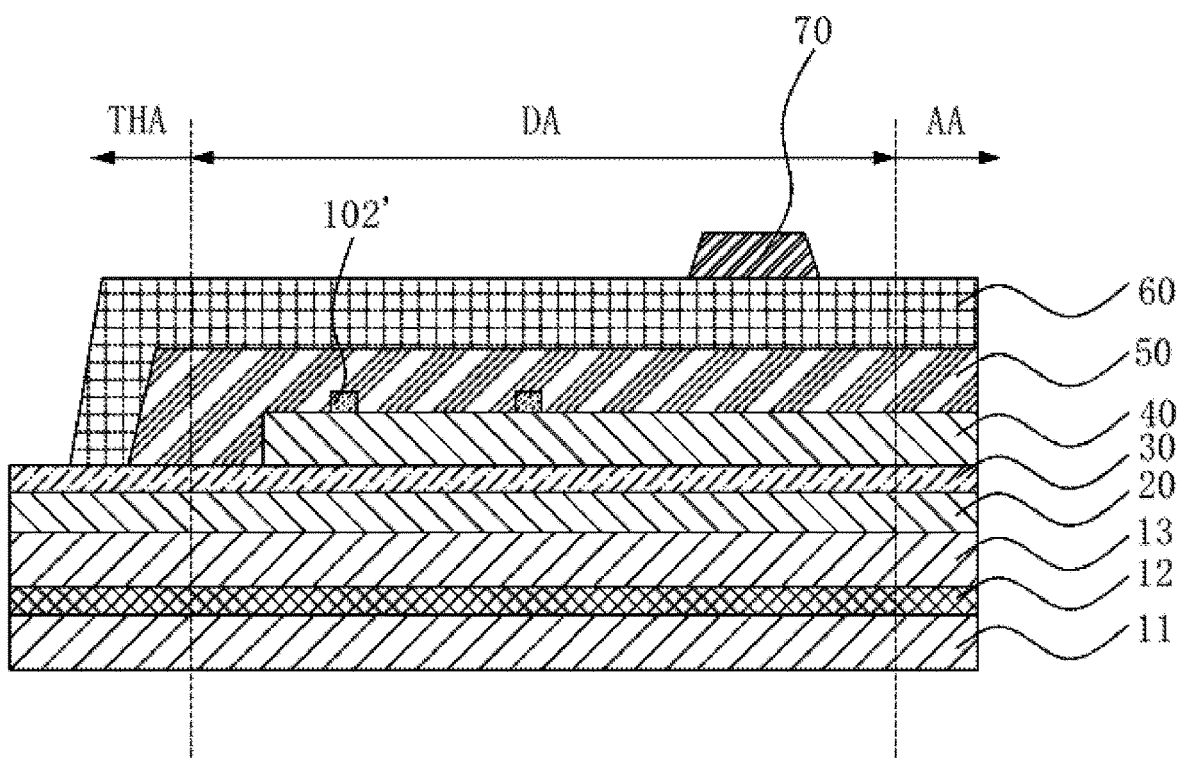
FIGS. 9 to 11 are schematic structural views illustrating the manufacturing method of the OLED display panel according to a second embodiment of the present invention.

As shown in FIG. 9, when the source/drain electrode is deposited on the interlayer insulating layer 40, two patterned metal blocks (i.e., the first metal blocks 102') in the blocking wall area DA are reserved.

Figure 10:
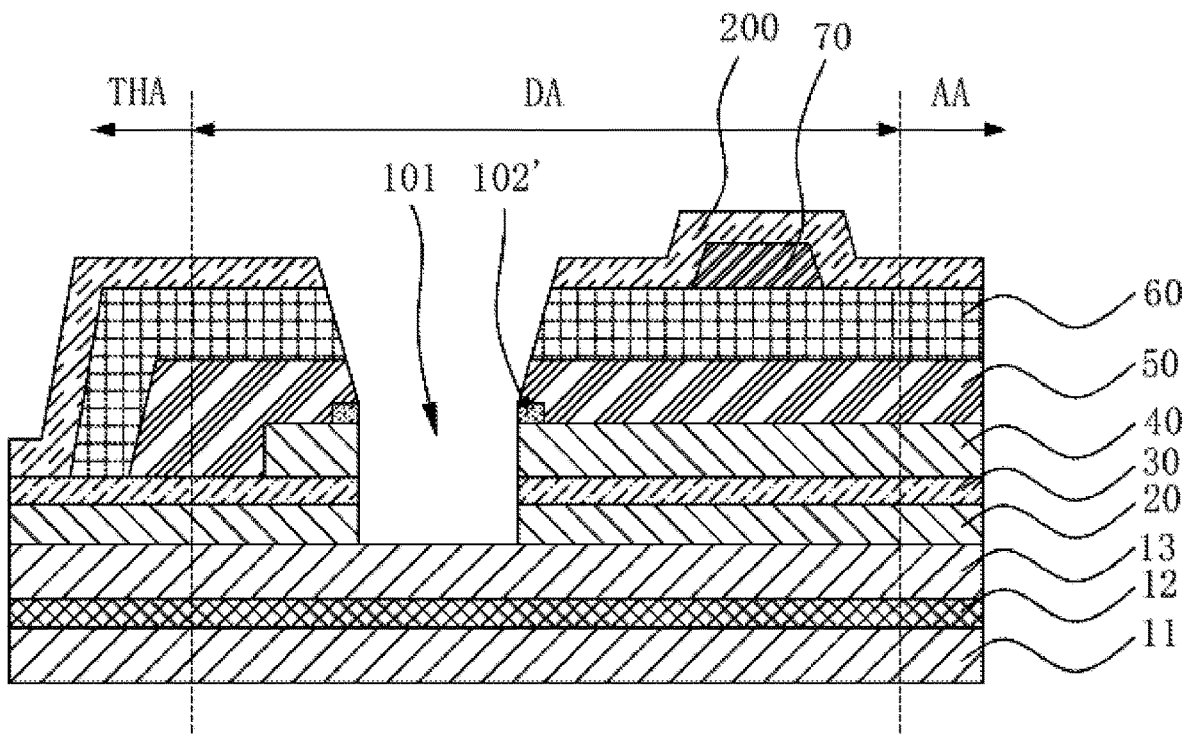

As shown in FIG. 10, after the pixel defining layer 60 is formed on the substrate 10, the layers in the blocking wall area DA are exposed and etched, and a via hole 101 is formed between the two first metal blocks 102'. The via hole 101 exposes side surfaces of the two first metal blocks 102'.

Figure 11:
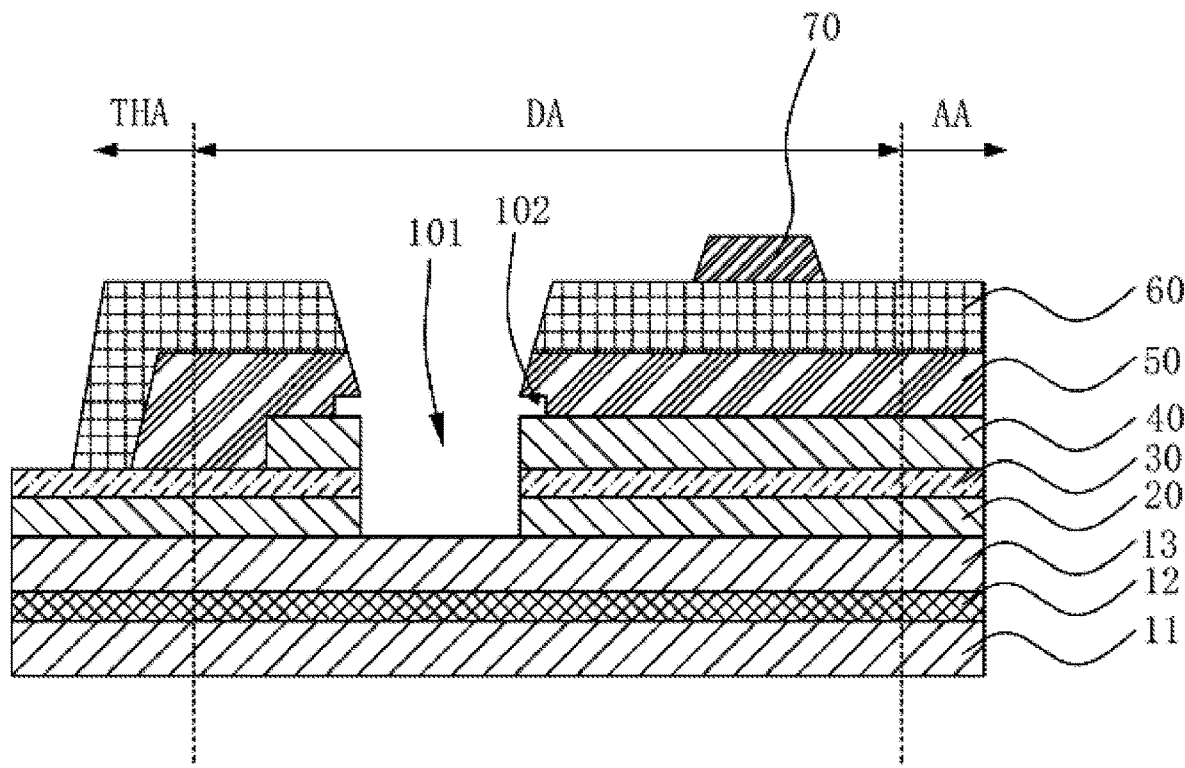

Then, as shown in FIG. 11, the two first metal blocks 102' are etched by using a hydrofluoric acid solution, and the recesses 102 are formed at the positions of the two first metal blocks 102'. Subsequent processes are the same as those in the first embodiment, so a detailed description is not repeated for brevity.

Advantages of the present invention: the deep via hole is formed between the edge of the through hole area and the edge of the display area, and the recess is in the side wall of the via hole, so that the subsequently deposited organic light emitting layer is disconnected at the recess to make the organic light emitting layer discontinuous at the recess, thus improving product reliability.

It is to be understood that equivalent changes and modifications can be made by persons of ordinary skill in the art in accordance with the technical solutions and technical concept of the present invention, and all such changes and modifications are regarded as falling within the scope of the present invention.

What is claimed is:

1. An organic light-emitting diode (OLED) display panel, having a blocking wall area defined between a through hole area and a display area, the OLED display panel comprising:
   a substrate;
   multiple inorganic layers disposed on the substrate;
   multiple organic layers disposed on the inorganic layers;
   a light emitting layer disposed on the organic layers;
   an encapsulation layer disposed on the light emitting layer; and
   a via hole extended through the inorganic layers and the organic layers;
   wherein the via hole is defined in the blocking wall area, the blocking wall area is a ring-shaped structure surrounding the through hole area, a side wall of the via hole comprises two recesses at two opposite sides of the side wall, two openings of the two recesses face each other, the light emitting layer is discontinuous at the two recesses, a width of each of the recesses along a direction perpendicular to a thickness direction of the substrate is greater than a thickness of the light emitting layer, the encapsulation layer covers the light emitting layer, and the encapsulation layer fills the two recesses completely.

2. The OLED display panel according to claim 1, wherein the inorganic layers comprise a buffer layer, a gate electrode insulating layer, and an interlayer insulating layer sequentially disposed in a direction away from the substrate.

3. The OLED display panel according to claim 2, wherein the organic layers comprise a planarization layer and a pixel defining layer sequentially disposed in a direction away from the substrate.

4. The OLED display panel according to claim 3, wherein each of the recesses is disposed between the interlayer insulating layer and the gate electrode insulating layer.

5. The OLED display panel according to claim 3, wherein each of the recesses is disposed between the interlayer insulating layer and the planarization layer.

6. An organic light-emitting diode (OLED) display pane, having a blocking wall area defined between a through hole area and a display area, the OLED display panel comprising:
   a substrate;
   multiple inorganic layers disposed on the substrate;
   multiple organic layers disposed on the inorganic layers;
   a light emitting layer disposed on the organic layers;
   an encapsulation layer disposed on the light emitting layer; and
   a via hole extended through the inorganic layers and the organic layers, wherein the via hole is defined in the blocking wall area, the blocking wall area is a ring-shaped structure surrounding the through hole area, a side wall of the via hole comprises two recesses at two opposite sides of the side wall, two openings of the two recesses face each other, and the light emitting layer is discontinuous at the two recesses.

7. The OLED display panel according to claim 6, wherein a width of each of the recesses along a direction perpendicular to a thickness direction of the substrate is greater than a thickness of the light emitting layer.

8. The OLED display panel according to claim 6, wherein the encapsulation layer covers the light emitting layer, and the encapsulation layer completely fills the two recesses.

9. The OLED display panel according to claim 6, wherein the inorganic layers comprise a buffer layer, a gate electrode insulating layer, and an interlayer insulating layer sequentially disposed in a direction away from the substrate.

10. The OLED display panel according to claim 9, wherein the organic layers sequentially comprise a planarization layer and a pixel defining layer sequentially disposed in a direction away from the substrate.

11. The OLED display panel according to claim 10, wherein each of the recesses is disposed between the interlayer insulating layer and the gate electrode insulating layer.

12. The OLED display panel according to claim 10, wherein each of the recesses is disposed between the interlayer insulating layer and the planarization layer.

13. The OLED display panel according to claim 1, wherein the blocking wall area is configured to space a boundary of the through hole area from a boundary of the display area, and the through hole area is configured to install a camera.

14. The OLED display panel according to claim 6, wherein the blocking wall area is configured to space a boundary of the through hole area from a boundary of the display area, and the through hole area is configured to install a camera.

* * * * *